US010355656B2

(12) United States Patent
Kim

(10) Patent No.: US 10,355,656 B2
(45) Date of Patent: Jul. 16, 2019

(54) AMPLIFICATION CIRCUIT WITH SPLIT-LENGTH COMPENSATION SCHEME

(71) Applicant: SK hynix Inc., Gyeonggi-do (KR)

(72) Inventor: Jungung Kim, Morgan Hill, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/021,859

(22) Filed: Jun. 28, 2018

(65) Prior Publication Data

US 2019/0007013 A1 Jan. 3, 2019

Related U.S. Application Data

(60) Provisional application No. 62/526,759, filed on Jun. 29, 2017.

(51) Int. Cl.
| | |
|---|---|
| *H03F 3/45* | (2006.01) |
| *H03F 3/21* | (2006.01) |
| *H03F 1/08* | (2006.01) |

(52) U.S. Cl.
CPC ......... *H03F 3/45188* (2013.01); *H03F 1/086* (2013.01); *H03F 3/211* (2013.01); *H03F 3/4565* (2013.01); *H03F 3/45192* (2013.01)

(58) Field of Classification Search
CPC ...................................................... H03F 3/45
USPC ........................................ 330/253, 260, 261
See application file for complete search history.

(56) References Cited

U.S. PATENT DOCUMENTS

| | | |
|---|---|---|
| 9,577,593 B2 | 2/2017 | Chiu et al. |
| 2007/0285164 A1* | 12/2007 | Adachi ................. H03F 3/3022 330/253 |
| 2008/0218265 A1* | 9/2008 | Murden ............... H03F 3/45242 330/253 |
| 2009/0066415 A1* | 3/2009 | Kim ....................... H03F 1/0205 330/253 |
| 2010/0244961 A1* | 9/2010 | Saigusa ............... H03F 3/45183 330/260 |
| 2016/0181983 A1* | 6/2016 | Kiran ..................... H03F 1/0205 330/253 |

OTHER PUBLICATIONS

Chaudhari, R. et al., Characterization and Simulation of High Speed CMOS Operational Amplifier Using Split-length Compensation, International Journal of Advance Engineering and Research Development and Research Development(IJAERD), vol. 1, Issue 5, May 2014.

* cited by examiner

*Primary Examiner* — Henry Choe
(74) *Attorney, Agent, or Firm* — IP & T Group LLP

(57) ABSTRACT

An amplification circuit includes: a current source; a first input transistor pair suitable for receiving a positive input voltage and having a split-length gate structure; a second input transistor pair suitable for receiving a negative input voltage and having a split-length gate structure; an enable unit suitable for supplying a current from the current source to each of the first input transistor pair and the second input transistor pair in response to an enable signal; a switching unit suitable for coupling a second split gate node between the second input transistor pair to a compensation capacitor node during an activation section of the enable signal; and a compensation driving unit suitable for compensating and driving a first split gate node between the first input transistor pair at an initial stage of the activation section of the enable signal.

8 Claims, 3 Drawing Sheets

AMPLIFICATION CIRCUIT WITH SPLIT-LENGTH COMPENSATION SCHEME

CROSS-REFERENCE TO RELATED APPLICATIONS

This application claims priority to U.S. Provisional Patent Application No. 62/526,759 entitled, "LOW-DROPOUT REGULATOR SCHEME FOR EQUALIZING INDIRECT COMPENSATION NODES", filed on Jun. 29, 2017, which is incorporated herein by reference in its entirety.

BACKGROUND

1. Field

Exemplary embodiments of the present invention relate to a semiconductor designing technology, and more particularly, to an amplification circuit with a split-length compensation scheme.

2. Description of the Related Art

Digital devices, especially mobile devices, are required to have low power consumption with high-speed operation. As for a battery-operated system with long standby time, such as those used in mobile devices, the importance of a Power Management Integrated Circuit (PMIC) to increase battery time is growing. As for the PMIC, a Low-DropOut (LDO) voltage regulator which is a linear regulator, is being widely used. Furthermore, the core circuit of the low-dropout voltage regulator is an error amplifier.

Typically, the error amplifier includes a negative feedback loop that causes over-shoot, ringing, or oscillation at an output terminal according to a delay of the feedback loop and the response characteristics of an amplifier system. In order to resolve this problem, a direct compensation scheme in which a compensation capacitor is interposed between an output terminal and an input terminal has been used.

SUMMARY

Embodiments of the present invention are directed to an amplification circuit that may prevent output instability originating from non-uniform operation of split gate nodes when a split-length compensation scheme is applied.

In accordance with an embodiment of the present invention, an amplification circuit includes: a current source; a first input transistor pair suitable for receiving a positive input voltage and having a split-length gate structure; a second input transistor pair suitable for receiving a negative input voltage and having a split-length gate structure; an enable unit suitable for supplying a current from the current source to each of the first input transistor pair and the second input transistor pair in response to an enable signal; a switching unit suitable for coupling a second split gate node between the second input transistor pair to a compensation capacitor node during an activation section of the enable signal; and a compensation driving unit suitable for compensating and driving a first split gate node between the first input transistor pair at an initial stage of the activation section of the enable signal.

DETAILED DESCRIPTION

Figure 1:
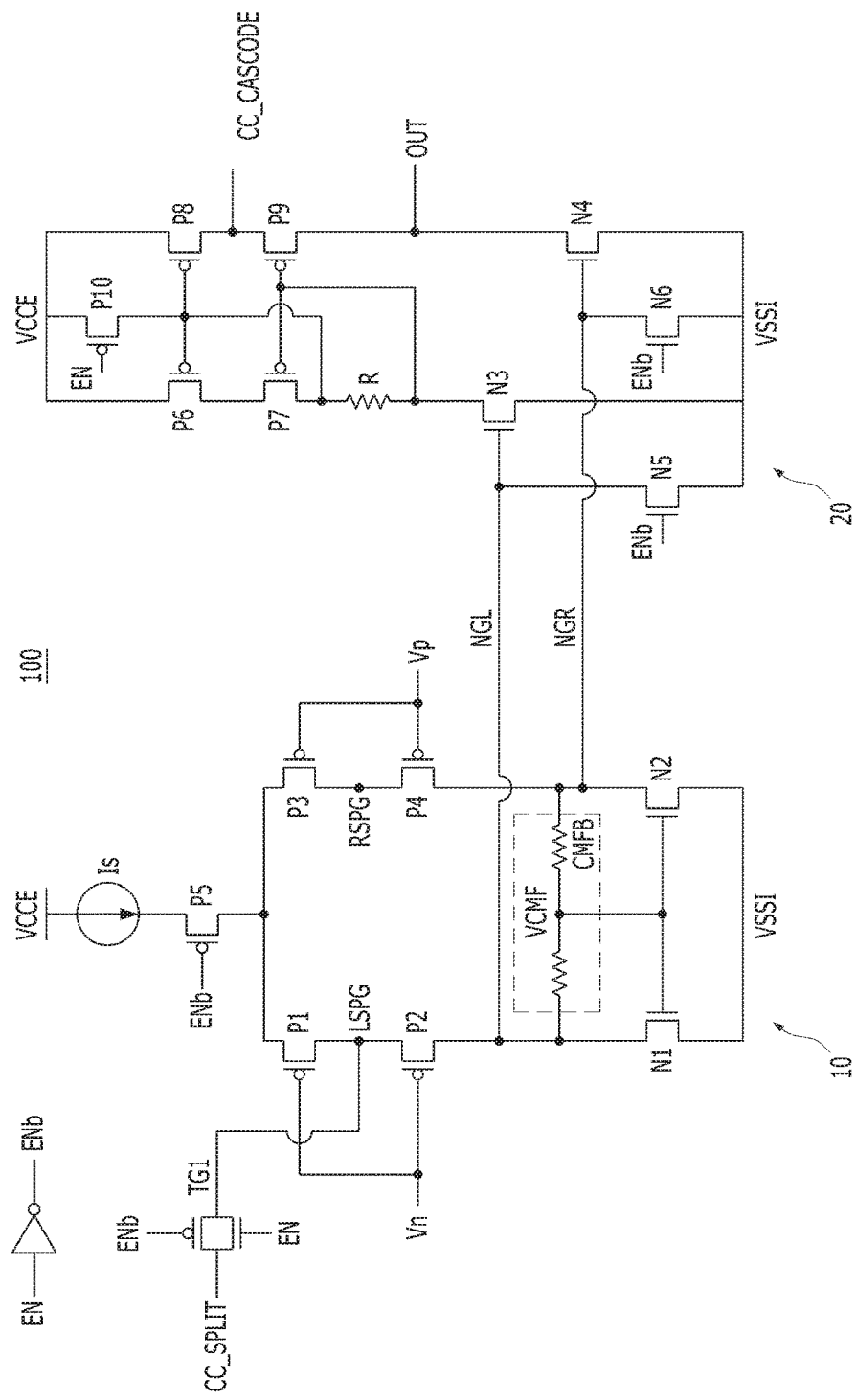
FIG. 1 is a circuit diagram exemplarily illustrating an amplification circuit with a split-length compensation scheme.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a circuit diagram exemplarily illustrating an amplification circuit 100 with a split-length compensation scheme.

Referring to FIG. 1, the amplification circuit 100 having the split-length compensation scheme may include a first amplification unit 10 and a second amplification unit 20 that are cascode-coupled. The first amplification unit 10 and the second amplification unit 20 may include all circuits, systems, firmware, and devices necessary for their respective operations and functions. From the perspective of a small-signal analysis, the amplification circuit 100 may have a structure of a cascode amplifier in which a common source amplifier and a common gate amplifier are serially coupled to each other in two stages. These cascode amplifier may have such advantages of large trans-conductance, high input impedance, and wide bandwidth. Also, the amplification circuit 100 may employ an indirect compensation scheme that uses a split-length gate structure together with the cascode coupling structure in order to secure transient performance. The split-length gate structure may generate a low-impedance internal node (which will be referred to, hereinafter, as a split gate node) between two transistors by replacing one input transistor with a pair of two input transistors having a gate length of a half. Herein, the pair of two input transistors with a gate length of a half may be equivalent to one conventional input transistor in terms of circuit.

The first amplification unit 10 may include a current source Is coupled to a power source voltage terminal VCCE, a first PMOS input transistor pair P3 and P4 for receiving a positive input voltage Vp, a second PMOS input transistor pair P1 and P2 for receiving a negative input voltage Vn, a PMOS enable transistor P5 for supplying a current to each pair of the input transistors in response to an enable signal ENb, an NMOS transistor N1 coupled between a ground voltage terminal VSSI and a first output terminal NGL, and an NMOS transistor N2 coupled between a second output terminal NGR and the ground voltage terminal VSSI. Herein, the NMOS transistors N1 and N2 may operate as a current mirror unit (or a loader), and they may be coupled to a common mode feedback bias VMFB that receives a common mode feedback voltage VCMF together with the first and second output terminals NGL and NGR. Meanwhile, the first PMOS input transistor pair P3 and P4 and the second PMOS input transistor pair P1 and P2 may correspond to the split-length gate structure mentioned above, individually.

There is a first split gate node RSPG between the first PMOS input transistor pair P3 and P4, and there is a second split gate node LSPG between the second PMOS input transistor pair P1 and P2. The second split gate node LSPG on the negative input side may be coupled to a compensation capacitor terminal CC_SPLIT during an enable section of the amplification circuit 100. A transmission gate TG1 controlled based on the enable signal EN and ENb may be used for selective switching with respect to the second split gate node LSPG. Herein, the enable signal EN may be activated to a logic level high in a section where the amplification circuit 100 is enabled, such as an active mode, and deactivated to a logic level low in a section where the amplification circuit 100 is disabled, such as a standby mode (or a power down mode). Meanwhile, the enable signal ENb may be an inverted signal of the enable signal EN.

The second amplification unit 20 may include an NMOS input transistor N3 for receiving a signal from the first output terminal NGL, an NMOS input transistor N4 for receiving a signal from the second output terminal NGR, a PMOS current mirroring transistor pair P6 and P7 and a passive resistor R that form one current path with the NMOS transistor N3, and a PMOS current mirroring transistor pair P8 and P9 that forms one current path with the NMOS input transistor N4. Also, the second amplification unit 20 may further include NMOS transistors N5 and N5 for precharging the first and second output terminals NGL and NGR to the ground voltage VSSI in a disable section of the amplification circuit 100 in response to the enable signal ENb, and a PMOS transistor P10 for precharging the gates of the PMOS current mirroring transistors P6 and P8 to the power source voltage VCCE in a disable section of the amplification circuit 100 in response to the enable signal EN. A final output terminal OUT of the amplification circuit 100 may be formed in a coupling node between the PMOS current mirroring transistor P9 and the NMOS input transistor N4, and a bias CC_CASCADE associated with a compensation capacitor (not shown) may be applied to the coupling node between the two PMOS current mirroring transistors P8 and P9.

When a device including the amplification circuit 100 enters the active mode, the enable signal EN may be activated to a logic high level, thereby enabling the amplification circuit 100. In other words, the PMOS transistor P5 may be turned on and the current supplied by the current source Is may flow through the first PMOS input transistor pair P3 and P4 and the second PMOS input transistor pair P1 and P2, individually. The currents flowing in the first PMOS input transistor pair P3 and P4 and the second PMOS input transistor pair P1 and P2 may differ according to the levels of the positive input voltage Vp and the negative input voltage Vn, and the difference in the currents may be amplified by the NMOS transistors N1 and N2 to determine the level of the first and second output terminals NGL and NGR. Herein, the potentials of both of the first split gate node RSPG and the second split gate node LSPG may be raised by the supplied current. However, since the compensation capacitor node CC_SPLIT is precharged to the power source voltage VCCE level during the disable section of the amplification circuit 100, when the transmission gate TG1 is turned on by the enable signals EN and Enb, the potential of the second split gate node LSPG may rise faster than the first split gate node RSPG through the charge sharing of the second split gate node LSPG with the compensation capacitor node CC_SPLIT. This may cause the potential of the first output terminal NGL to rise more rapidly than the potential of the second output terminal NGR and as a result, the final output terminal OUT of the amplification circuit 100 may rise regardless of the level of the negative input voltage Vn, causing output instability of the amplification circuit 100.

Figure 2:
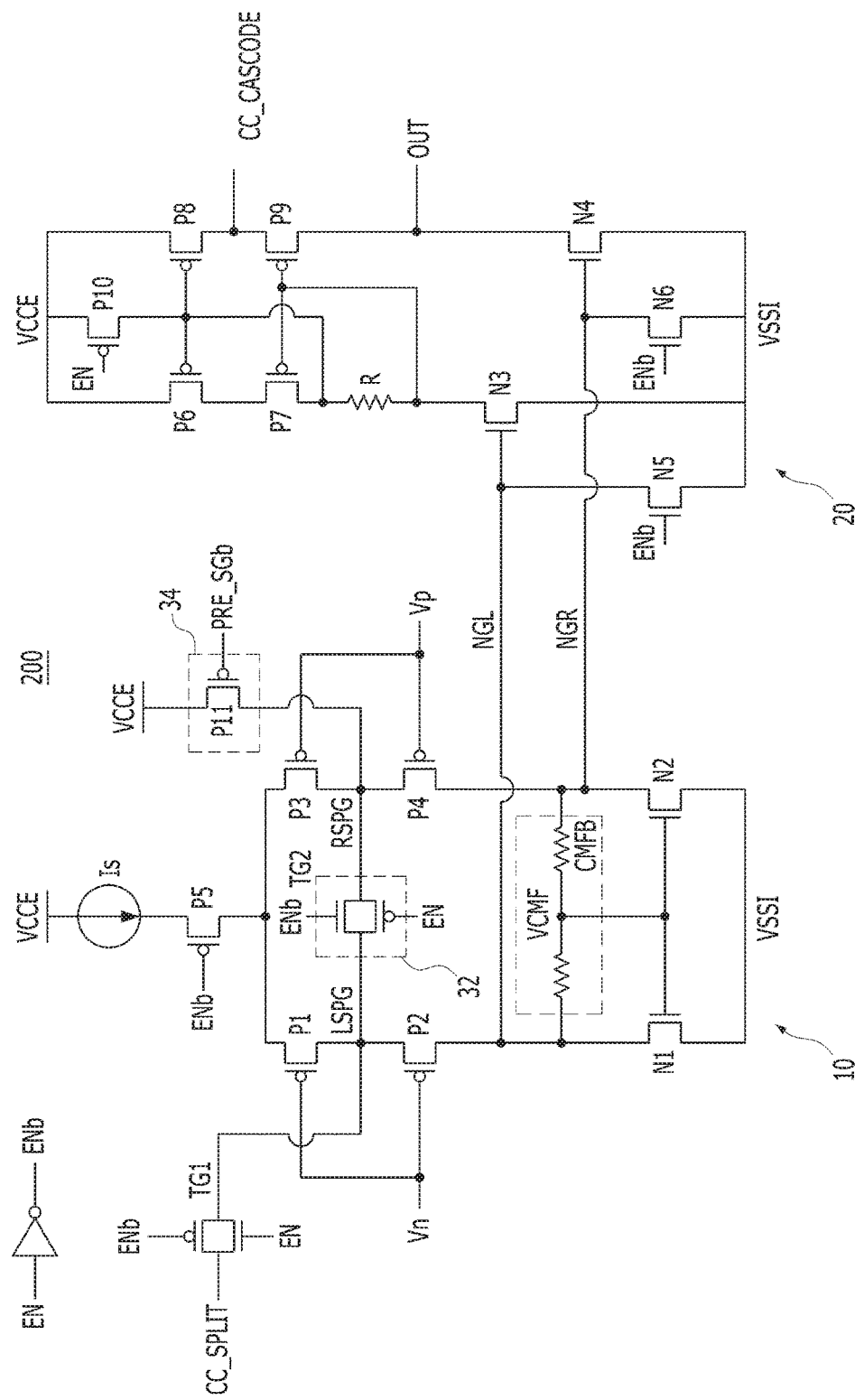
FIG. 2 is a circuit diagram illustrating an amplification circuit with a split-length compensation scheme in accordance with an embodiment of the present invention.

FIG. 2 is a circuit diagram illustrating an amplification circuit 200 with a split-length compensation scheme in accordance with an embodiment of the present invention.

Referring to FIG. 2, the amplification circuit 200 with the split-length compensation scheme in accordance with the embodiment of the present invention may include a first amplification unit 30 and a second amplification unit 40 that are cascode-coupled. From the perspective of a small signal, the amplification circuit 200 may have a structure of a cascode amplifier in which a common source amplifier and a common gate amplifier are serially coupled in two stages.

Meanwhile, the first and second amplification units 30 and 40 may correspond to the first and second amplification units 10 and 20, respectively. In other words, the second amplification unit 40 (i.e., a secondary amplification unit) may have the same structure as that of the second amplification unit 20 of FIG. 1, and the first amplification unit 30 as well may have basically the same structure as that of the first amplification unit 10 shown in FIG. 1, except for additional constituent elements.

Just like the first amplification unit 10 of FIG. 1, the first amplification unit 30 may include a current source Is coupled to a power source voltage terminal VCCE, a first PMOS input transistor pair P3 and P4 for receiving a positive input voltage Vp, a second PMOS input transistor pair P1 and P2 for receiving a negative input voltage Vn, a PMOS enable transistor P5 for supplying a current to each pair of the input transistors in response to an enable signal Enb, an NMOS transistor N1 coupled between a first output terminal NGL and a ground voltage terminal VSSI, and an NMOS transistor N2 coupled between a second output terminal NGR and the ground voltage terminal VSSI, a transmission gate TG1 for selectively connecting a split gate node LSPG and a compensation capacitor node CC_SPLIT in response to an enable signal EN and Enb. The PMOS enable transistor P5 may form an enable unit. The transmission gate TG1 may form a switching unit.

Hereinafter, the constituent elements added to the structure of the first amplification unit 30 are mainly described compared with the first amplification unit 10 of FIG. 1.

The first amplification unit 30 may further include an equalizing unit 32 for equalizing a first split gate node RSPG between the first PMOS input transistor pair P3 and P4 and a second split gate node LSPG between the second PMOS input transistor pair P1 and P2 in response to the enable signals EN and Enb. Also, the first amplification unit 30 may further include a compensation driving unit 34 for pull-up driving the first split gate node RSPG in the initial stage of the enable section of the amplification circuit 200 in response to a compensation driving pulse PRE_SGb. The equalizing unit 32 and the compensation driving unit 34 may include all circuits, systems, firmware, and devices necessary for their respective operations and functions.

The equalizing unit 32 may be realized with a transmission gate TG2 for selectively coupling the first split gate node RSPG and the second split gate node LSPG. The transmission gate TG2 may couple the first split gate node RSPG and the second split gate node LSPG in the enable section of the amplification circuit 200 to equalize the two nodes, when the enable signal EN is in a logic low level and the enable signal ENb is in a logic high level, that is, in the enable section of the amplification circuit 200.

The compensation driving unit 34 may be realized with a PMOS transistor P11 that is coupled between the power source voltage terminal VCCE and the first split gate node RSPG and receives the compensation driving pulse PRE_SGb through a gate. The PMOS transistor P11 may be turned on during a section where the compensation drive pulse PRE_SGb is activated to the logic low level to pull-up drive the first split gate node RSPG.

Figure 3:
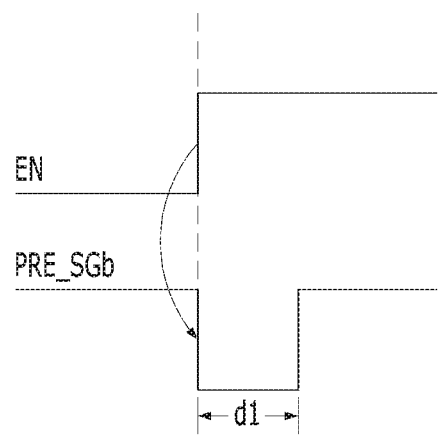
FIG. 3 shows a waveform of a control signal of the amplification circuit illustrated in FIG. 2.

FIG. 3 shows a waveform of control signals of the amplification circuit illustrated in FIG. 2. Referring to FIG. 3, when a device including the amplification circuit 200 is switched from the standby mode to the active mode and the enable signal EN transitions from a logic low level to a logic high level, the compensation driving pulse PRE_SGb may pulse to a logic low level during a predetermined time dl.

Figure 4:
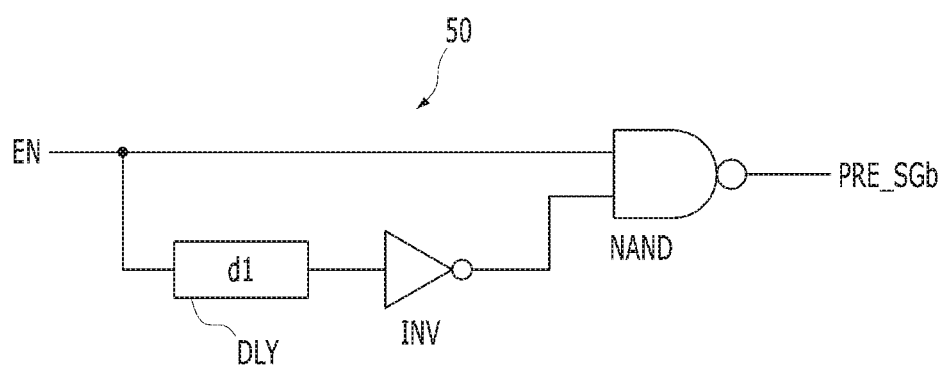
FIG. 4 illustrates a circuit structure of a pulse generated for generating a compensation driving pulse shown in FIG. 3.

The circuit structure of a pulse generator 50 for generating the compensation driving pulse PRE_SGb having the waveform is illustrated in FIG. 4. Referring to FIG. 4, the pulse generator 50 may include a delayer DLY for delaying the enable signal EN for a predetermined time d1, an inverter INV for inverting an output signal of the delayer DLY, and a NAND gate NAND for receiving the enable signal EN and the output signal of the inverter INV and outputting the compensation driving pulse PRE_SGb. The delayer DLY may be realized with an inverter chain generally having an even number of inverters, and the number of the inverters may be adjusted according to the desired delay value d1.

When the device including the amplification circuit 200 exits from the standby mode (or the power down mode) and enters the active mode, the PMOS transistor P5 may be turned on so that the current supplied by the current source Is may flow through the first PMOS input transistor pair P3 and P4 and the second PMOS input transistor pair P1 and P2, individually. Herein, the potentials of both of the first split gate node RSPG and the second split gate node LSPG may rise due to the supplied current. As described above, since the compensation capacitor node CC_SPLIT is precharged to the power source voltage VCCE level while the amplification circuit 200 is disabled, when the transmission gate TG1 is turned on based on the enable signals EN and Enb, the potential of the second split gate node LSPG may rise faster than that of the first split gate node RSPG through charge sharing of the second split gate node LSPG with the compensation capacitor node CC_SPLIT.

In the initial stage of the enable section of the amplification circuit 200, the compensation driving unit 34 may be enabled to pull-up drive the first split gate node RSPG with the power source voltage VCCE. The pull-up driving for the first split gate node RSPG may raise the potential of the second split gate node LSPG according to the rapid rise in the potential of the second split gate node LSPG in the initial stage of the enable section of the amplification circuit 200. Therefore, it is possible to prevent the output instability in the initial operation of the amplification circuit 200. Meanwhile, the equalizing unit 32 may allow the compensation driving unit 34 to perform a compensation driving operation in a state that the first split gate node RSPG and the second split gate node LSPG maintain the same level. In other words, the equalizing unit 32 may help stable operation of the compensation driving unit 34.

Although it is illustrated in the above-described embodiment of the present invention that there are both of the equalizing unit 32 and the compensation driving unit 34, the equalizing unit 32 may be omitted in some cases, and even through the equalizing unit 32 may be omitted, the compensation effect intended in the embodiment of the present invention may be ensured sufficiently.

It is described in the above-described embodiment of the present invention that the amplification circuit 200 is designed as a cascade amplifier including the first and second amplification units 30 and 40. However, the spirit and concept of the present invention may be applied to the designing of all error amplifiers including an input terminal of a split-length gate scheme. For example, the present invention may be also applied to a case where the form of the second amplification unit 40 is changed or the second amplification unit 40 is omitted.

According to the embodiment of the present invention, it is possible to prevent the output of the amplification circuit from being instable by equalizing split gate nodes while the amplification circuit applying the split-length compensation scheme is disabled, and compensating and driving a group of the split gate nodes in the initial stage of an enable section of the amplification circuit.

While the present invention has been described with respect to the specific embodiments, it will be apparent to those skilled in the art that various changes and modifications may be made without departing from the spirit and scope of the invention as defined in the following claims.

What is claimed is:

1. An amplification circuit, comprising:
   a current source;
   a first input transistor pair suitable for receiving a positive input voltage and having a split-length gate structure;
   a second input transistor pair suitable for receiving a negative input voltage and having a split-length gate structure;
   an enable unit suitable for supplying a current from the current source to each of the first input transistor pair and the second input transistor pair in response to an enable signal;
   a switching unit suitable for coupling a second split gate node between the second input transistor pair to a compensation capacitor node during an activation section of the enable signal; and
   a compensation driving unit suitable for compensating and driving a first split gate node between the first input transistor pair at an initial stage of the activation section of the enable signal.

2. The amplification circuit of claim 1, further comprising:
   an equalizing unit suitable for equalizing the first split gate node and the second split gate node during a deactivation section of the enable signal.

3. The amplification circuit of claim 1, further comprising:
   a first current mirroring transistor coupled to a first output terminal corresponding to the second input transistor pair; and
   a second current mirroring transistor coupled to a second output terminal corresponding to the first input transistor pair.

4. The amplification circuit of claim 1, further comprising:
   a secondary amplification unit that are cascode-coupled to a first output terminal corresponding to the second input transistor pair and a second output terminal corresponding to the first input transistor pair.

5. The amplification circuit of claim 1, wherein the switching unit is controlled based on the enable signal, and includes a first transmission gate coupled between the second split gate node and the compensation capacitor node.

6. The amplification circuit of claim 1, wherein the compensation driving unit pull-up drives the first split gate node in response to a compensation driving pulse that pulses in the initial stage of the activation section of the enable signal.

7. The amplification circuit of claim 6, wherein the compensation driving unit includes the PMOS transistor that is coupled between a power source voltage terminal and the first split gate node, and receives the compensation driving pulse through a gate.

8. The amplification circuit of claim 2, wherein the equalizing unit is controlled based on the enable signal, and includes a second transmission gate coupled between the first split gate node and the second split gate node.

* * * * *